(12) United States Patent
Getz et al.

(10) Patent No.: US 8,203,207 B2
(45) Date of Patent: Jun. 19, 2012

(54) ELECTRONIC DEVICE PACKAGES AND METHODS OF FORMATION

(75) Inventors: James W. Getz, Blacksburg, VA (US);
David W. Sherrer, Radford, VA (US);
John J. Fisher, Taylors, SC (US)

(73) Assignee: Samsung Electronics Co., Ltd., Suwon-si (KR)

( * ) Notice: Subject to any disclaimer, the term of this patent is extended or adjusted under 35 U.S.C. 154(b) by 427 days.

(21) Appl. No.: 12/072,157

(22) Filed: Feb. 25, 2008

(65) Prior Publication Data

US 2009/0256251 A1    Oct. 15, 2009

Related U.S. Application Data

(60) Provisional application No. 60/903,490, filed on Feb. 25, 2007.

(51) Int. Cl.
*H01L 23/04* (2006.01)
*H01L 29/06* (2006.01)
*H01L 29/40* (2006.01)
*H01L 21/4763* (2006.01)
*H01L 21/44* (2006.01)
*H01L 21/302* (2006.01)

(52) U.S. Cl. ........ 257/698; 257/774; 257/621; 257/623; 257/626; 257/E23.193; 438/106; 438/637; 438/640; 438/667; 438/668; 438/671; 438/735; 438/736

(58) Field of Classification Search ................. 257/621, 257/623, 626, 698, 774, E23.193, E21.499; 438/40, 43, 106, 637, 640, 667–680, 735–736, 438/459–460, 977
See application file for complete search history.

(56) References Cited

U.S. PATENT DOCUMENTS

| | | | |
|---|---|---|---|
| 731,445 A * | 6/1903 | Esterly et al. | 34/232 |
| 5,351,163 A * | 9/1994 | Dawson et al. | 361/321.1 |
| 6,359,333 B1 | 3/2002 | Wood et al. | |
| 6,392,158 B1 * | 5/2002 | Caplet et al. | 174/255 |
| 6,582,992 B2 * | 6/2003 | Poo et al. | 438/109 |
| 6,611,052 B2 * | 8/2003 | Poo et al. | 257/686 |
| 6,864,172 B2 * | 3/2005 | Noma et al. | 438/674 |
| 7,633,159 B2 * | 12/2009 | Boon et al. | 257/730 |
| 7,704,796 B2 * | 4/2010 | Pagaila et al. | 438/113 |
| 2002/0111035 A1 * | 8/2002 | Atobe et al. | 438/753 |
| 2004/0016942 A1 * | 1/2004 | Miyazawa et al. | 257/200 |

(Continued)

FOREIGN PATENT DOCUMENTS

EP        0 448 713        10/1991

(Continued)

OTHER PUBLICATIONS

European Search Report of corresponding European Application No. EP 08 15 1799 mailed Jun. 6, 2008.

(Continued)

*Primary Examiner* — Kiesha Bryant
*Assistant Examiner* — Jeremy Joy
(74) *Attorney, Agent, or Firm* — Sughrue Mion, PLLC

(57) ABSTRACT

Provided are electronic device packages and their methods of formation. The electronic device packages include an electronic device mounted on a substrate, a conductive via and a locally thinned region in the substrate. The invention finds application, for example, in the electronics industry for hermetic packages containing an electronic device such as an IC, optoelectronic or MEMS device.

11 Claims, 9 Drawing Sheets

U.S. PATENT DOCUMENTS

| | | | |
|---|---|---|---|
| 2004/0188822 A1* | 9/2004 | Hara | 257/689 |
| 2005/0059204 A1 | 3/2005 | Heschel | |
| 2005/0110157 A1* | 5/2005 | Sherrer et al. | 257/776 |
| 2005/0111797 A1 | 5/2005 | Sherrer et al. | |
| 2006/0094158 A1 | 5/2006 | Lee et al. | |
| 2006/0094231 A1* | 5/2006 | Lane et al. | 438/637 |
| 2007/0262381 A1 | 11/2007 | Kojima | |
| 2008/0076195 A1* | 3/2008 | Shiv | 438/15 |
| 2009/0065907 A1* | 3/2009 | Haba et al. | 257/621 |
| 2009/0267096 A1* | 10/2009 | Kim | 257/98 |
| 2011/0079893 A1 | 4/2011 | Sherrer et al. | |

FOREIGN PATENT DOCUMENTS

| | | | |
|---|---|---|---|
| GB | 2 136 203 | | 9/1984 |
| GB | 2136203 A | * | 9/1984 |
| JP | 2002-510863 A | | 4/2002 |
| JP | 2005-506701 A | | 3/2005 |
| JP | 2005-136384 A | | 5/2005 |
| JP | 2006-128683 A | | 5/2006 |
| JP | 2007-305804 A | | 11/2007 |
| WO | WO 98/27588 | | 6/1998 |
| WO | WO 2006/097842 A1 | | 9/2006 |

OTHER PUBLICATIONS

Communication issued on Jun. 24, 2011 in the corresponding European Patent Application No. 08151799.7.

Japanese Office Action issued on Aug. 9, 2011 in the corresponding Japanese Patent Application No. 2008-042222.

Taiwanese Office Action dated Feb. 6, 2012 in counterpart Taiwanese application No. 097106413.

* cited by examiner

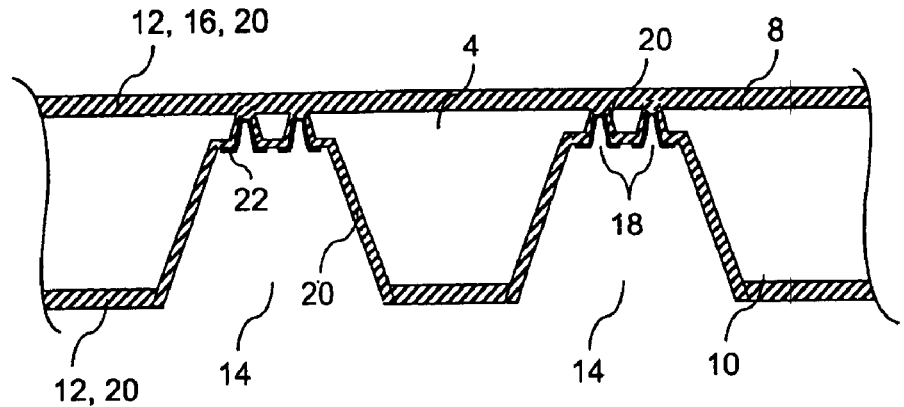
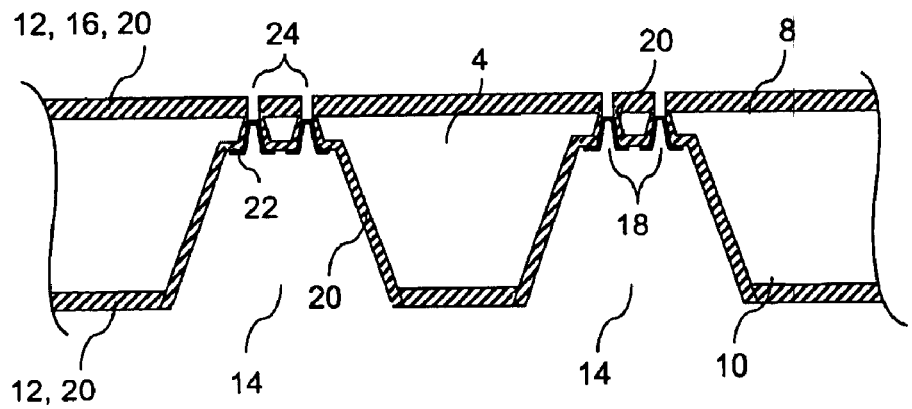
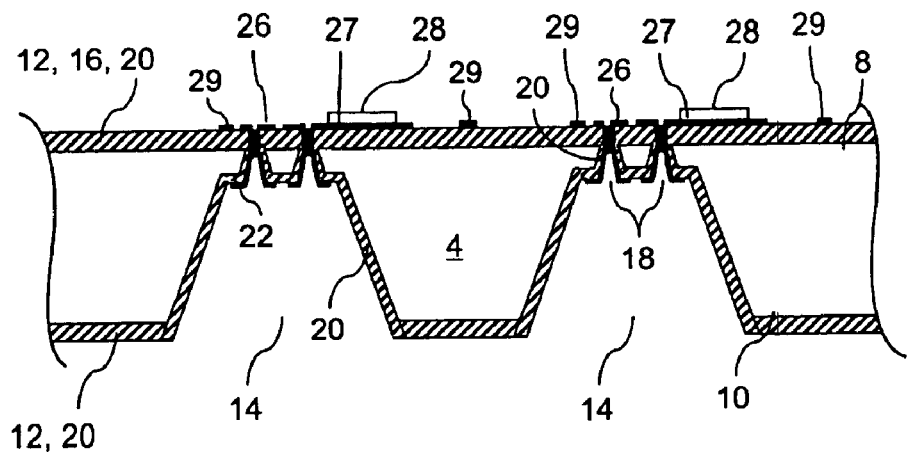

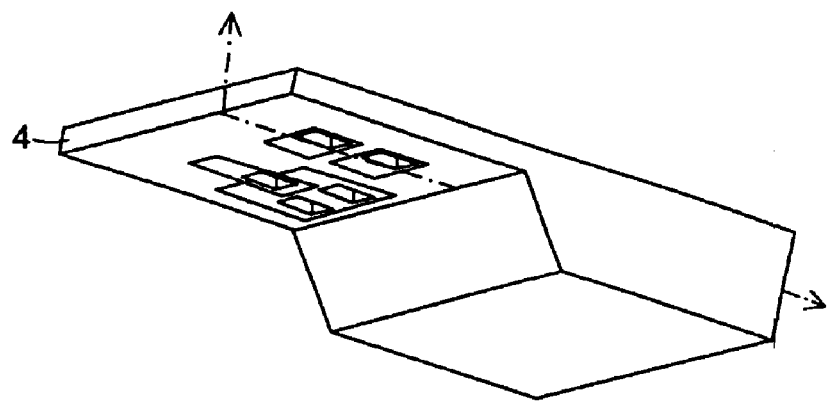
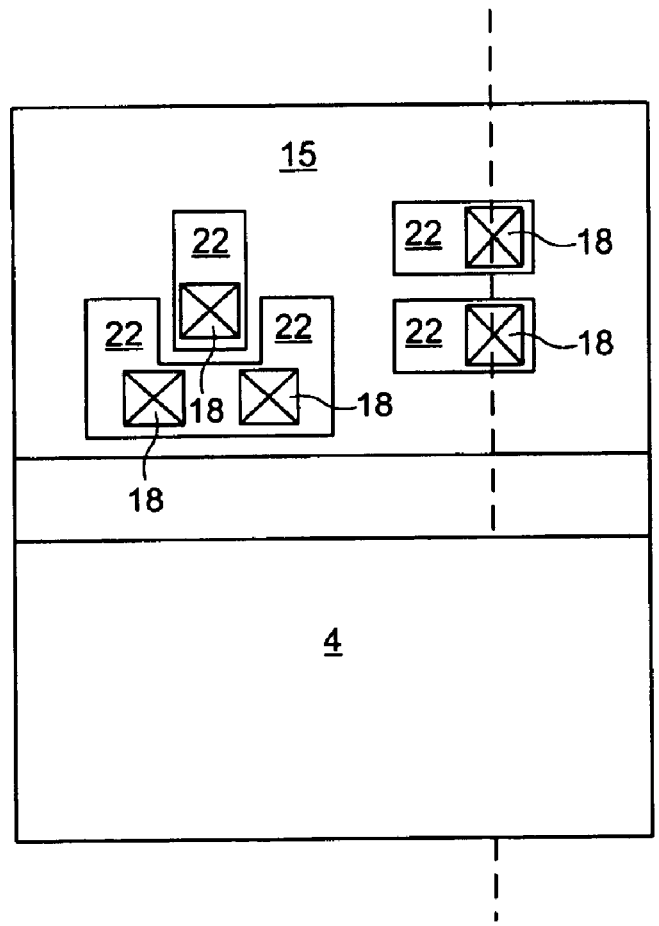
*FIG. 15*

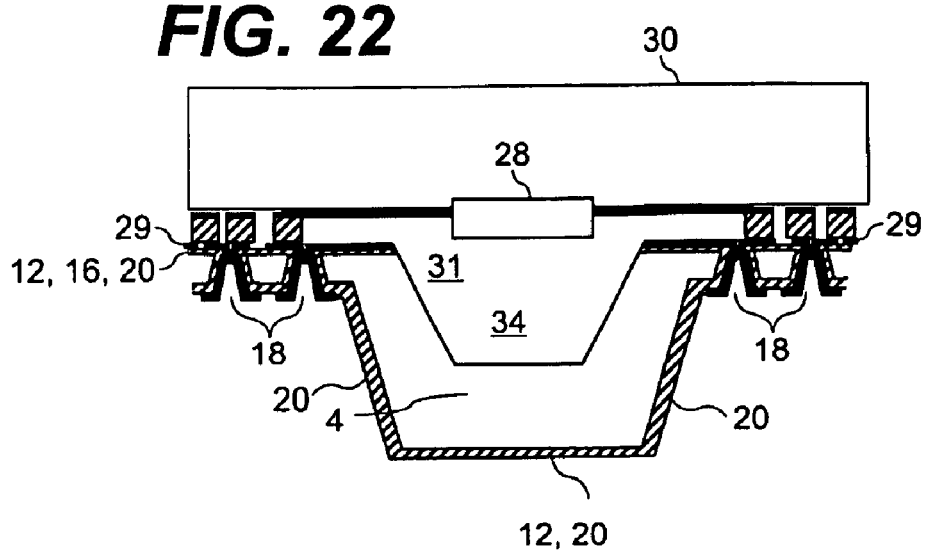
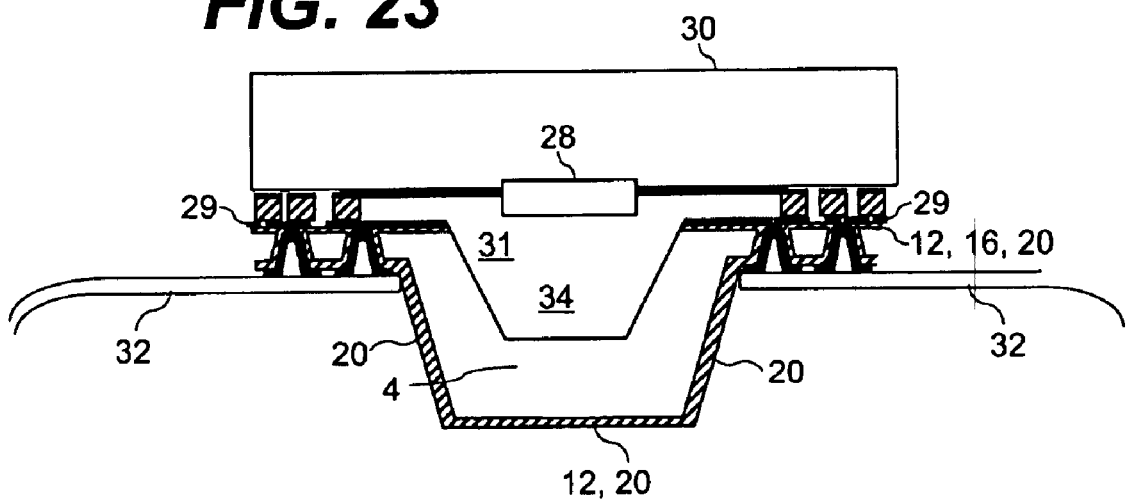
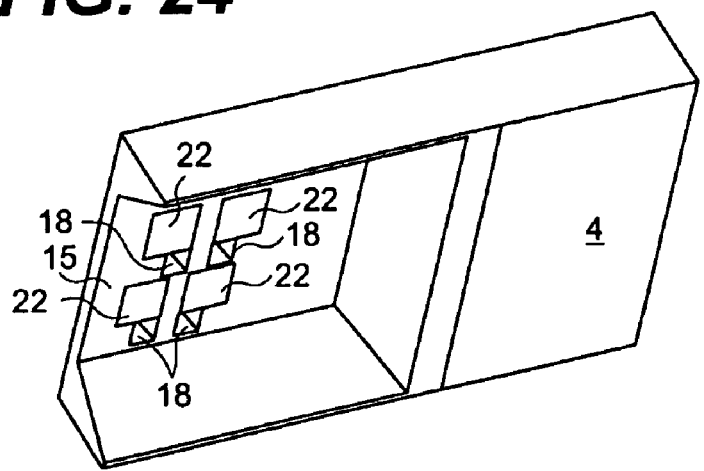

ELECTRONIC DEVICE PACKAGES AND METHODS OF FORMATION

This application claims the benefit of priority under 35 U.S.C. §119(e) to U.S. Provisional Application No. 60/903,490, filed Feb. 25, 2007, the entire content of which application is incorporated herein by reference.

This invention relates generally to microfabrication technology and, in particular, to electronic device packages and their methods of formation. The invention finds application, for example, in the electronics industry for hermetic packages containing one or more electronic devices such as an optoelectronic, IC or MEMS device.

Hermetically sealed chip-scale and wafer-level packages containing electronic devices, for example, integrated circuits (ICs), optoelectronic devices and micro-electro-mechanical systems (MEMS), are known. Such packages often include an enclosed volume which is hermetically sealed, formed between a base substrate and lid, with the electronic device being disposed in the enclosed volume. These packages provide for containment and protection of the enclosed devices from contamination and water vapor present in the atmosphere outside of the package. The presence of contamination and water vapor in the package can give rise to problems such as corrosion of metal parts as well as optical losses in the case of optoelectronic devices, optical MEMS and other optical components. In addition, these packages are sometime sealed under vacuum or a controlled atmosphere to either allow proper operation or to meet the desired lifetime for the device.

For purposes of providing electrical connectivity between the electronic device enclosed in the package and the outside world, an electrical feedthrough between the package interior and exterior is required. Various types of electrical feedthroughs for hermetic packages have been disclosed. For example, U.S. Patent Application Publication No. US20050111797A1, to Sherrer et al, discloses the use of conductive vias in a hermetically sealed optoelectronic package. The optoelectronic device is disposed on a substrate, such as a silicon substrate, and is enclosed in a hermetic volume by a lid attached to the substrate. Conductive vias extend through the substrate to provide electrical connectivity to the device. In an exemplified via formation process of the aforementioned published application, vias are etched from one side through the entire thickness of the substrate to a silicon nitride membrane, the vias are metallized, the nitride is patterned and removed and the vias are connected on the top side to create a hermetic electrical via. The minimum size attainable for vias is generally limited by the aspect ratio of the via etching process and the thickness of the substrate.

It would be desirable to have the capability to form densely packed metallized vias in the electronic device packages. In this way, it would be possible to provide a package having a reduced geometry. This would provide the added benefit of allowing an increase in the number of packages which may be formed on a wafer in a wafer-level process, thereby reducing manufacturing cost. As well, reducing the size of the vias can help to reduce the parasitic inductance and/or capacitance associated with the via structures, thereby improving via performance at microwave frequencies.

International Application Publication No. WO 2006/097842 A1 discloses techniques for fabricating a relatively thin package for housing a semiconductor component, such as an optoelectronic or MEMS device, which may be conducted on the wafer-level. This document discloses in one embodiment a micro-component mounted on or integrated with the same wafer in which a feedthrough metallization is provided and that includes a back-side wafer thinning technique. A silicon/oxide/silicon wafer is used in the process. Micro-vias are formed through the silicon on the device side of the wafer into the oxide etch-stop layer. A micro-component is mounted to an area on the device side between the micro-vias, and a semiconductor or glass lid wafer is bonded to the first wafer so that the microcomponent is housed within an area defined by the two wafers. After bonding the wafers, a thinning process is performed on the back surface silicon layer of the first layer.

The above-described device and method have various drawbacks. For wafers containing vias as well as precision microelectronics, such as transmission lines, thin film patterned solders or capacitors, on the device side of the wafer as in WO '842, precision lithography and patterning is required. Precision lithography calls for a planar or nearly planar surface to allow thin photoresists to be coated and properly exposed and patterned. If vias are etched from and created on the front surface of the wafer prior to formation of the microelectronics on the same surface, the vias interfere with proper spin-coating of photoresist on the wafer. The result is often poor coverage and inconsistent patterning. Methods such as spraying photoresist and electroplating photoresist have been used. However, these methods are not capable of the high precision patterning required due to inconsistent resist thickness in the former case and relatively large thickness in the latter case. This makes patterning precision features such as RF transmission lines and resistors with high yields particularly challenging or impossible.

If vias are fabricated from and on the front surface of the wafer after creation of the microelectronics on the same surface, the microelectronics must withstand the processes used to form the vias. For anisotropically etched vias, this typically means exposure for times from 20 minutes to several hours to aggressive alkaline etches which often attack the materials used in the microelectronics, such as tin used in solders, Ni—Cr and TaN used in resistors, and titanium which is often used in forming an adhesion layer. In addition, creating vias after the large number of processing steps required to produce microelectronics can result in significant cost in the event of yield failures.

There is thus a need in the art for improved electronic device packages and for their methods of formation which would address one or more of the problems associated with the state of the art.

In accordance with a first aspect of the invention, provided are electronic device packages. The electronic device packages include a substrate having a first surface and a second surface opposite the first surface. The second surface has a locally thinned region therein. A conductive via in the locally thinned region extends through the substrate to the first surface. The conductive via and the locally thinned region each comprise a tapered sidewall, wherein the taper of the conductive via sidewall and of the locally thinned region sidewall are in the same direction. An electronic device is mounted on the first surface of the substrate. The electronic device is electrically connected to the conductive via.

Electronic device packages in accordance with a second aspect of the invention include a substrate having a first surface and a second surface opposite the first surface. The second surface has a locally thinned region therein. A conductive via in the locally thinned region extends through the substrate to the first surface. An electronic device is mounted on the first surface of the substrate. The electronic device is electrically connected to the conductive via. A flex circuit disposed at least partially in the locally thinned region and electrically connected to the conductive via.

In accordance with a further aspect of the invention, methods of forming an electronic device package are provided. The methods include: (a) providing a substrate having a first surface and a second surface opposite the first surface; (b) thinning a portion of the substrate from the second surface to form a locally thinned region in the second surface; (c) etching a via in the locally thinned region extending through the substrate, wherein the etching is conducted in a direction from the locally thinned surface to the first surface; (d) metallizing the via, wherein the conductive via and the locally thinned region each comprise a tapered sidewall, wherein the sidewall tapers of the conductive via and of the locally thinned region are in the same direction; and (e) mounting an electronic device on the first surface of the substrate, wherein the electronic device is electrically connected to the conductive via.

In accordance with a further aspect of the invention, methods of forming an electronic device package include: (a) providing a substrate having a first surface and a second surface opposite the first surface; (b) thinning a portion of the substrate from the second surface to form a locally thinned region in the second surface; (c) forming a via in the locally thinned region extending through the substrate to the first surface; (d) metallizing the via; (e) mounting an electronic device on the first surface of the substrate, wherein the electronic device is electrically connected to the conductive via; and (f) providing a flex circuit disposed at least partially in the locally thinned region and electrically connected to the conductive via.

In the electronic device packages and methods of formation, the substrate may include, for example, a semiconductor such as single-crystal-silicon, and take the form of a silicon or silicon-on-insulator (SOI) wafer or portion thereof. The electronic device may be hermetically sealed in the electronic device package. One or more conductive vias, typically a plurality of conductive vias, are formed in the locally thinned region. The locally thinned region may extend to a first edge of the substrate, conveniently allowing for the provision of a flex circuit disposed at least partially in the locally thinned region and electrically connected to the conductive via. A lid may be provided on the first surface to form a sealed volume which encloses the electronic device. In an exemplary aspect of the invention, the wafer is locally thinned and vias are formed in the locally thinned region from the same side of the substrate. Advantageously, the electronic device package may be formed on the wafer-level, the wafer having a plurality of die each containing an electronic device package.

Other features and advantages of the present invention will become apparent to one skilled in the art upon review of the following description, claims, and drawings appended hereto.

The present invention will be discussed with reference to the following drawings, in which like reference numerals denote like features, and in which:

FIGS. 1-14 illustrate cross-sectional views of an exemplary electronic device package at various stages of formation thereof in accordance with a first aspect of the invention;

FIG. 15 illustrates an elevated view of an exemplary electronic device package substrate in accordance with the invention, as well as a partial bottom-up view of the substrate;

FIGS. 20-23 illustrate cross-sectional views of an exemplary electronic device package at various stages of formation thereof in accordance with a further aspect of the invention;

FIG. 24 illustrates an elevated view of an exemplary electronic device package substrate in accordance with a further aspect of the invention.

The invention provides improved methods of forming electronic device packages as well as electronic device packages which may be formed thereby. The packages include a substrate which has in a surface thereof a locally thinned region and a conductive via in the locally thinned region extending through the substrate. An electronic device is electrically connected to the conductive via. The electronic device may be disposed on the opposite surface of the substrate from the surface in which the locally thinned region and conductive via are formed. Alternatively, the electronic device may be disposed on a separate substrate which forms a lid that seals to the via-containing substrate. The via is electrically connected to the electronic device.

As used herein, the terms "a" and "an" mean one or more; "microstructure" refers to structures formed by microfabrication or nanofabrication processes, typically but not necessarily on a wafer-level; and "wafer-level" refers to processes taking place with any substrate from which a plurality of die is formed including, for example, a complete wafer or portion thereof if multiple die are formed from the same substrate or substrate portion.

Methods of forming the electronic device packages in accordance with the invention will now be described with reference to FIGS. 1-14, which illustrate cross-sectional views of an exemplary electronic device package at various stages of formation thereof in accordance with the invention.

Figure 1:
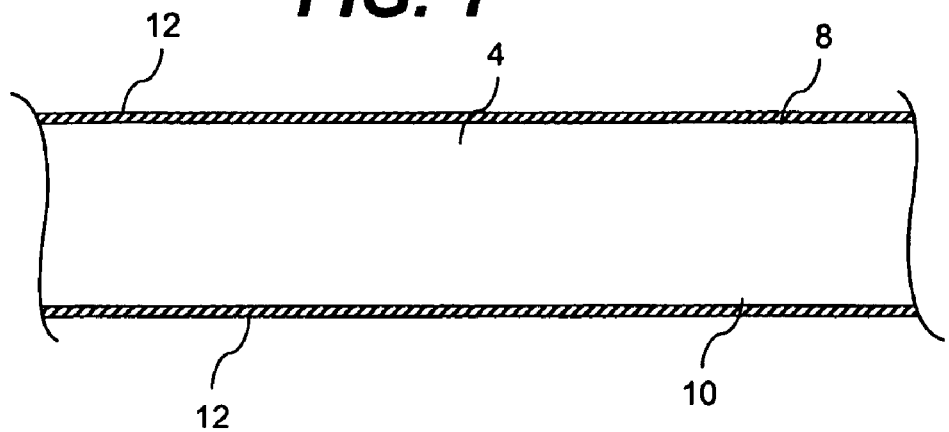
Figure 2:
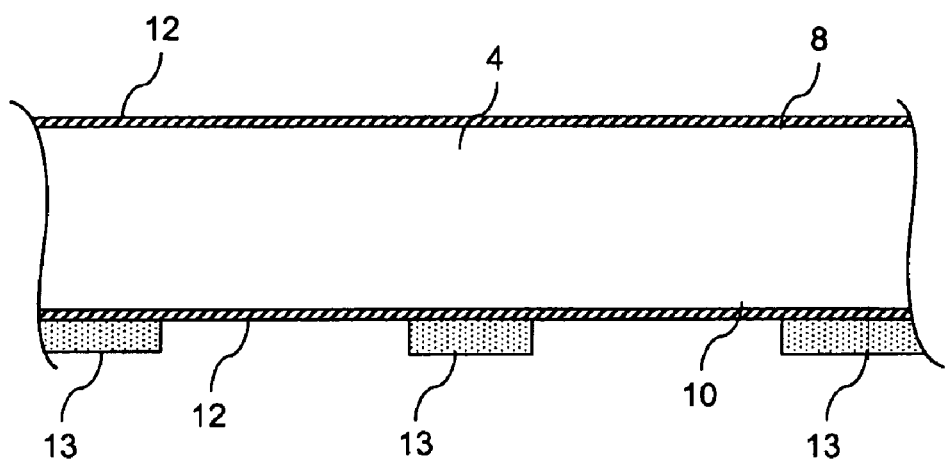

As shown in FIG. 1, a substrate 4 is provided. The substrate has a first (device or front) surface 8 and a second (back) surface 10 opposite the first surface. The substrate 4 may be formed of any material suitable for use in packaging of electronic devices such as semiconductor materials, metals, ceramics, and glasses. Typically, the substrate material includes a single crystalline semiconductor material such as single-crystalline silicon, silicon-on-insulator or silicon-germanium substrate. The substrate can be of a dimension allowing for formation of a single component or, more typically, a plurality of identical components as multiple die. Typically, the substrate will be in the form of a wafer having multiple die. In the exemplified method, a <100> double-sided polished silicon wafer is provided as the substrate. The thickness of the wafer may conveniently be about 525±25 microns in thickness, and the resistivity is typically greater than 1000 ohm-cm for high frequency applications, although lower resistivities may be used.

One or more hard mask layers may be provided on the front and back surfaces of the substrate or a portion thereof for use as a hard mask and optionally for electrical isolation between the substrate and electrical structures such as conductors and electronic devices disposed thereon. Typically, the hard mask layer is a dielectric layer chosen from, for example, low stress silicon nitrides, doped and undoped silicon oxides, including spin-on-glasses, silicon oxynitrides and titanium dioxide. Such dielectric layers may be formed by known techniques such as plasma-enhanced or low-pressure chemical vapor deposition (PECVD or LPCVD), physical vapor deposition (PVD) such as sputtering or ion beam deposition, spin-coating, anodization or thermal oxidation. The thickness of the dielectric layer will depend on factors such as the particular material and subsequent process conditions. Typical thicknesses for the dielectric layer are from 100 to 250 nanometers (nm). In the exemplified method, a low stress LPCVD silicon nitride layer is provided on the first and second surfaces of the substrate at a thickness, for example, from 200 to 500 nm such as from 200 to 250 nm.

A first hard mask layer 12 disposed on the back surface 10 of the substrate is patterned, typically using standard photolithography and dry-etching techniques to provide an opening exposing the underlying substrate material which is to be locally thinned. A patterned photoresist or other suitable photoimageable material is provided on the substrate back surface 10 as an etch mask 13, exposing those areas of the first hard mask layer to be removed. Optionally, a crystal alignment step may be preformed to determine the precise axis of crystallographic alignment so that the features to be etched can be aligned to the crystal axis to the required degree of precision. The regions of the first hard mask layer 12 exposed through the etch mask 13 on the back surface of the substrate may be removed by dry-etching to expose the underlying substrate material. The etchant will depend, for example, on the material of the first hard mask layer 12. In the exemplified method which employs a silicon nitride layer, plasma dry-etching with $CF_4$ or other suitable fluorine-containing etchant is typical at a pressure of, for example, 50 to 500 mTorr.

Figure 3:
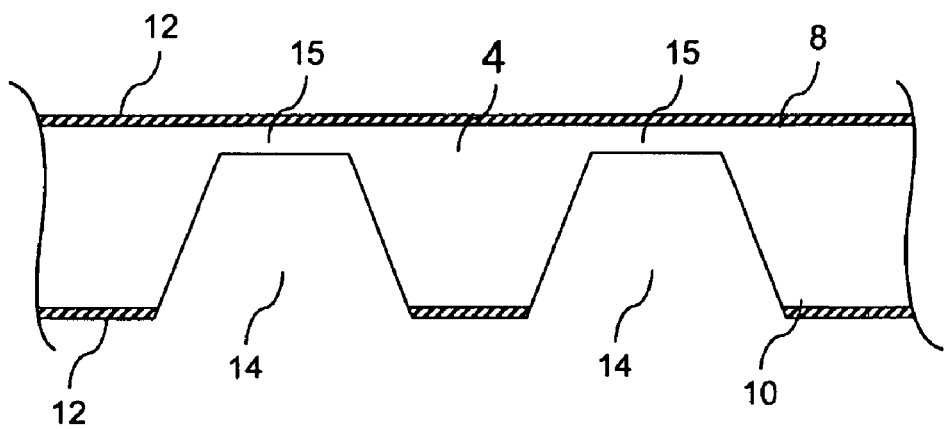

With reference to FIG. 3, the exposed regions of the substrate back surface 10 are then thinned, for example, by anisotropic etching through the openings in the first hard mask layer 12 until a pyramidal pit 14 for each opening is formed in the substrate. FIG. 3 illustrates the substrate 4 after removal of the exposed regions of the first hard mask layer, conducting localized thinning and removal of the etch mask. The anisotropic etch is typically a crystallographic etch using, for example, KOH or EDP. Typically, the pit 14 extends to a distance from 50 to 250 microns from the substrate front surface 8. Only a select portion or portions 15 of the substrate are thinned rather than the entire surface. This allows for maintenance of mechanical stiffness for subsequent processing and handling to help avoid breakage. It is particularly beneficial in the case of a micro-optical platform, where sufficient thickness is required for creating precision etched structures in the substrate front surface to hold elements such as ball lenses and other optical components. Such etched structures may be as deep as or deeper than the thinned region 15, which is typically required only for the vias.

A typical pit 14 formed by the localized thinning has a bottom surface of from 0.5 to 5 millimeters (mm) along each side, in the case of a square geometry. The locally thinned regions may run the length of one or more sidewalls of the die. In manufacturing, these regions may run across multiple die or the entire length of a wafer in one dimension. The opposite dimension of the pit may be determined by the number of micro-vias required and the space needed to interconnect the micro-vias externally using either flex circuitry and/or solder balls or pads. For <100> silicon, the sidewalls of the pyramidal pit 14 are {111} crystal plane surfaces when created by anisotropic wet etching. Based on known pit depth and sidewall angle, one can calculate the size of the target opening to be provided in the first hard mask layer 12. Optionally, the localized thinning may be carried out by mechanical cutting or dicing, dry-etching or by a combination of wet and dry-etching.

During the localized thinning, the first hard mask layer 12 in the regions adjacent the opening may become undercut which tends to create nitride shelves (not shown) on the sides of the opening. Prior to metallization of the surfaces of the pit 14, it may be desirable to remove the nitride shelves to prevent or reduce the likelihood of shadowing during the subsequent metallization process. Shadowing can lead to discontinuous and/or nonuniform metallization of the pit surfaces under the shelves.

The nitride shelves may be removed by a dry-etching step using, for example $CF_4$ at a pressure sufficient to etch the nitride shelves, typically from 50 to 1000 mTorr. Because silicon nitride can be chemically attacked by fluorine ions and other fluorine-containing species in the etching process, and because the pressure is high enough to allow significant scattering of the molecules over a short distance, both sides of the nitride shelves are etched, whereas only one surface of the silicon nitride is attacked on all other surfaces because they are either bonded to the substrate on one side or have a surface that is otherwise shielded, for example, by facing the etching reactor plate/electrode. Thus, nitride shelves can be removed without completely removing the nitride on the remainder of the substrate. The shelf removal may be conducted at other stages, such as after a further silicon nitride coating if such a coating is used, but should be conducted prior to the metallization to ensure continuity of the metallization. This process may be omitted even if shelves are present, for example, where there is significant scattering during the metallization process, where the nitride shelves are small or where a conformal conductor deposition is used.

After localized thinning and the optional shelf removal processes, the etch mask may be removed using well known stripping techniques and chemistries which will depend, for example, on the etch mask material.

Figure 4:
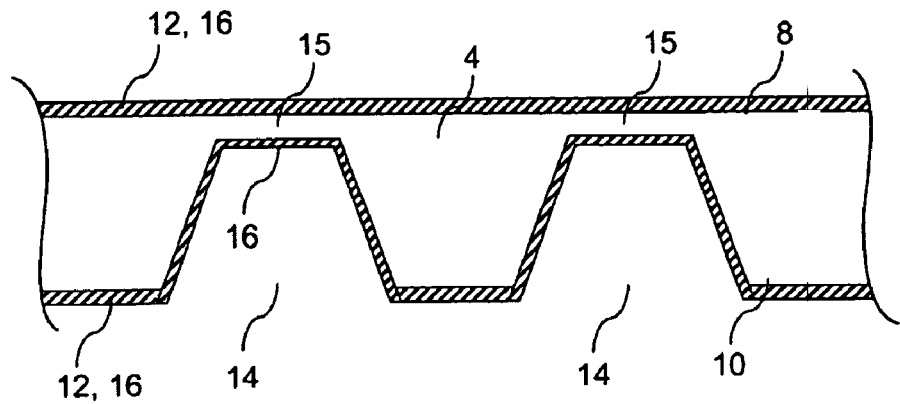

With reference to FIG. 4, a second hard mask layer 16 of an insulating material is formed over the substrate in order to insulate the surfaces of the locally thinned region 15. The material for the second hard mask layer is typically the same as but may be different from the first hard mask layer 12. Suitable materials, techniques and thicknesses are as described above with respect to the first hard mask layer. In the exemplified method, the second hard mask layer 16 is a low-stress silicon nitride layer of similar thickness to the first nitride layer. The second hard mask layer is used to electrically isolate the vias to be formed in the locally thinned regions of the substrate.

The present via formation methods, whether conducted with wet etching and/or dry-etching, allow for the device surface of the substrate to maintain a high degree of planarity, allowing precision coating of resist and optionally contact lithography to pattern the subsequent mounting features, conductive traces and alignment features on the device surface of the substrate. In addition, the present methods allow one to perform the second hard mask coating before any metals or solders are applied, allowing the use of LPCVD coatings such as low stress silicon nitrides and oxides with conformal coatings of determined stresses.

Figure 5:
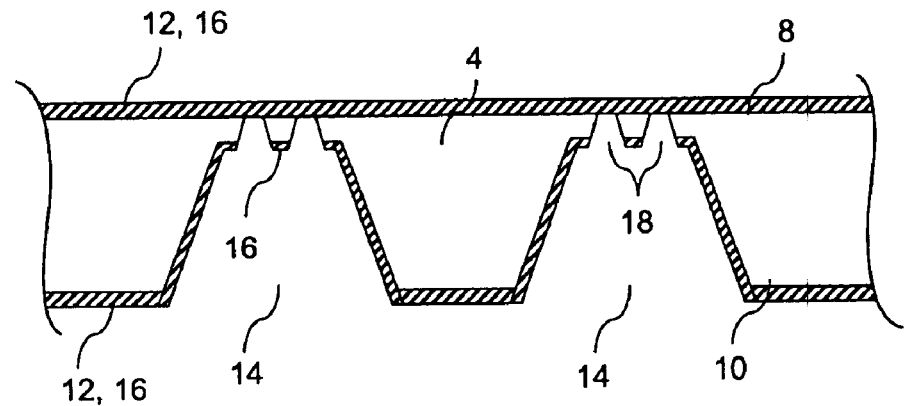

With reference to FIG. 5, one or more micro-vias 18 may next be formed in the locally thinned region 15 of the substrate. The micro-vias may be formed by photolithographic patterning and etching techniques, in which a photoresist or other suitable photoimageable material (not shown) is provided on the substrate back surface over the second hard mask layer 16, exposed and developed to form an etch mask which exposes those areas of the second hard mask in the locally etched region in which the vias are to be formed. The exposed regions of the second hard mask are removed by etching as described above with respect to the etching of the first hard mask material. The underlying regions of the substrate in the locally thinned regions are thereby exposed and are subsequently etched to the first hard mask layer 12 on the front surface of the substrate. The substrate etching may be conducted with anisotropic etching through the openings in the second hard mask layer 16. As with the locally thinned region in the exemplary embodiment, the sidewalls of the micro-vias comprise {111} crystal plane surfaces when wet anisotropic etching is done and <100> silicon is the substrate material. A typical micro-via opening at its bottom surface is from 20 to 200 microns, for example, from 40 to 200 microns along each side, in the case of a square geometry.

As described above for the locally thinned regions, determination of a suitable mask opening for the micro-vias can be made based on the known depth of the via and sidewall angle to arrive at a desired micro-via dimension. In the case of anisotropic crystallographic etches from the same side of the substrate for forming the locally thinned region and the micro-via, the sidewalls of those features taper in the same direction. Same-side etching of the pits 14 and micro-vias is desirable, for example, to allow for greater accuracy in patterning precision features on the opposite side of the substrate. Optionally, the localized thinning may be carried out by dry-etching or by a combination of wet and dry-etching. At this stage, the etch mask used in forming the micro-vias is removed from the wafer with known materials and techniques. The resulting structure is illustrated in FIG. 5. A thickness of the hard mask layer may be removed from the substrate back surface, for example, by wet-etching, for example, hydrofluoric acid (HF), buffered HF, or phosphoric acid solutions, and/or dry etching. This allows for greater dimensional control in later steps. For purposes of the illustrated device structure, a thickness corresponding to the second hard mask layer 16 is shown as being removed from the device.

Figure 6:
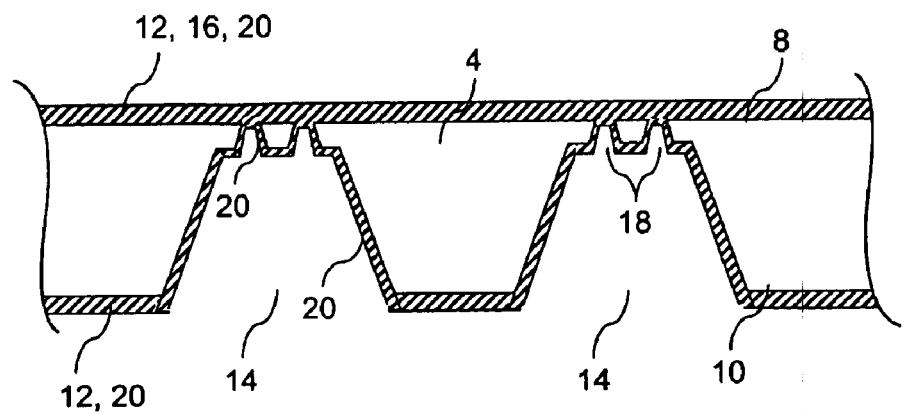

As shown in FIG. 6, the surfaces of the pits 14 and micro-vias 18 are coated with a third hard mask layer 20 and a thickness such as described above with respect to the first and second hard mask layers. The third hard mask provides electrical isolation in the completed device package. In the exemplified method, the third hard mask layer 20 is a low-stress silicon nitride layer of similar thickness to the first and second mask layers.

The micro-vias 18 may next be metallized from the substrate backsurface to form conductors 22 as illustrated in FIG. 7. The metallization structures may be patterned, for example, with a shadow mask, a conformal lift-off resist, an electrodeposited resist, a spray coated resist or a laminated patterned resist. The metallization structures cover those portions of the hard mask exposed at the bottom of the micro-vias, and provide conductivity along the micro-via sidewall to the substrate front surface 8. The metal is chosen to have sufficient mechanical strength to become free standing after complete or partial removal of the hard mask material from the front surface of the substrate. As a result of the metallization, a conductive and hermetic seal across the micro-via aperture may be realized. The metal may be, for example, Cr/Ni/Au, TiW/Au or Ti/Pt/Au. A stacked layer of, for example, 20 nm thick Cr, followed by 200 nm thick Ni, covered by 500 nm thick Au has sufficient mechanical strength to span, for example, 20 to 35 microns across a micro-via aperture. Thinner or thicker metal layers may, however, be used. In addition, one can electroplate such metals or add electroplated metal to vapor deposited metals to greater thicknesses if needed for greater strength, to make larger membranes or for higher currents.

After metallization of the micro-vias from the substrate back surface, the substrate front surface at this point is still planar. The localized thinning of the substrate in the vicinity of the micro-vias has the effect of minimizing parasitic effects associated with larger via structures, for example, via structures that extend through the full thickness of the substrate. It is thus desirable that the via not extend completely through the full thickness of the substrate. Locally thinning the substrate and micromachining the vias from the same side provides the added benefit that a planar surface can be maintained for the substrate front surface for forming microelectronic features. As a result, the micro-vias may be created in the substrate prior to the more expensive and complex processing performed on the device surface of the substrate. This can have a significant impact in reducing the cost of yielded devices. Still further, a planar substrate front surface allows for the use of standard spin-coated thin resists and photolithographic techniques to be used in forming critical features of the package requiring precise definition. Such features include, for example, transmission lines and thin film solders. A planar surface further facilitates the precision micromachining required, for example, in the case of micro-optical components such as pit formation for ball lens placement.

The substrate front surface is next coated with a photoresist or other photoimageable material, patterned, and dry-etched from the planar front surface to form openings 24 through the hard mask layers 12, 16, 20 to the underlying micro-via metallization 22, as shown in FIG. 8. The metal layer may act as a suitable etch stop for plasma etching or other film removal technique. Any pattern can be opened in the front surface hard mask material, for example, circular or rectangular holes, grids, or other geometries, allowing the hard mask to provide added mechanical stability, if desired. The hard mask material may be patterned in a manner that allows multiple conductors for a micro-via if the metal on both sides and the sidewalls can be appropriately patterned. Typically, a rectangular or circular shape would be used to make the patterning and spacing easier.

Referring to FIG. 9, metallization of the substrate planar front surface may be conducted to provide various features, such as conductive traces 26 that electrically communicate with the metal layers 22 of the micro-vias and with electronic devices 28 in the device package. Suitable materials are known in the art, and include, for example, those described above with respect to the micro-via metallization 22. A metal layer may be applied and patterned, for example, by shadow masking, electrodeposited resist, by lift off, or by chemical etching of the metal, among other methods known in the art of microelectronics. The metal structure may be deposited by known techniques, such as one or more of evaporation, sputtering, CVD and electro-chemical and electroless chemical plating of one or more metals, for example, using a seed process and patterned mask if desired. Plating may be especially useful for relatively thick layers, for example, thick gold-containing layers such as several micron thick gold layers used to make coplanar microwave transmission lines or to create gold bumps for gold thermocompression bonding of devices. Any combination of these techniques may be employed. Solder pads 27 for bonding the electronic devices may also be formed at this time. Typical solder pad materials include, for example, Au—Sn eutectics, or indium or other alloys chosen for their melting points and mechanical and attach process properties, and may be formed by any of the techniques described herein with respect to the other metal features.

At this time, it may also be desired to provide a metal sealing ring 29 for subsequent bonding of a lid over the device surface to provide a hermetically sealed enclosure for the electronic device. A metal sealing ring that is complementary in geometry to the sealing surface of a lid to be bonded to the front surface is typically employed, although use of a solder glass or covalent bonding techniques such as those sold by Ziptronics, Inc is also envisioned. For this purpose, a metal may be deposited on the substrate surface and/or the lid. The metal sealing ring may be formed, for example, of a metal stack comprising an adhesion layer, a diffusion barrier, and a wettable metal layer. For example chrome and titanium are common adhesion layers, nickel, platinum and TiW are common diffusion barriers, and gold is a common wettable metal. In addition the ring may include a solder, for example, an about 80:20 Au—Sn of from 3 to 8 microns in thickness on the lid sealing surface, the substrate surface, or both. Optionally, such gold layer may be patterned, or the entire sealing ring may be patterned, in such a way to cause the metal solder to selectively flow in given regions, wicking more or less solder where desired during the lid attachment step. Such an arrangement can be useful if there are regions of transition or topology or higher surface roughness, and a thicker metal solder layer is desired for the seal in that region, for example, when sealing over electrical or optical waveguides that may exit the package.

After metallization of the substrate planar surface, one or more electronic devices 28 are bonded to the substrate surface in the case of a prefabricated electronic device. The electronic device may be, for example, one or more of an optoelectronic, IC or MEMS device. It is also envisioned that the electronic device can be formed at least partially as part of the substrate or formed on the substrate in an in-situ manner. This may be the case, for example, for MEMS devices, such as a BAW device, a microbolometer focal plane array or an RF switch, or for laser and photo diodes and other optoelectronic devices. It is further envisioned that the electronic device can be mounted on a package lid as will be described in greater detail below. In the case of a prefabricated electronic device, bonding to the substrate may be conducted by conventional techniques and materials, for example, bonding to a pre-formed solder pad 27 on the substrate front surface, attachment to solders on the device or substrate surface, or use of epoxy or gold bump fusion bonding.

Figure 10:
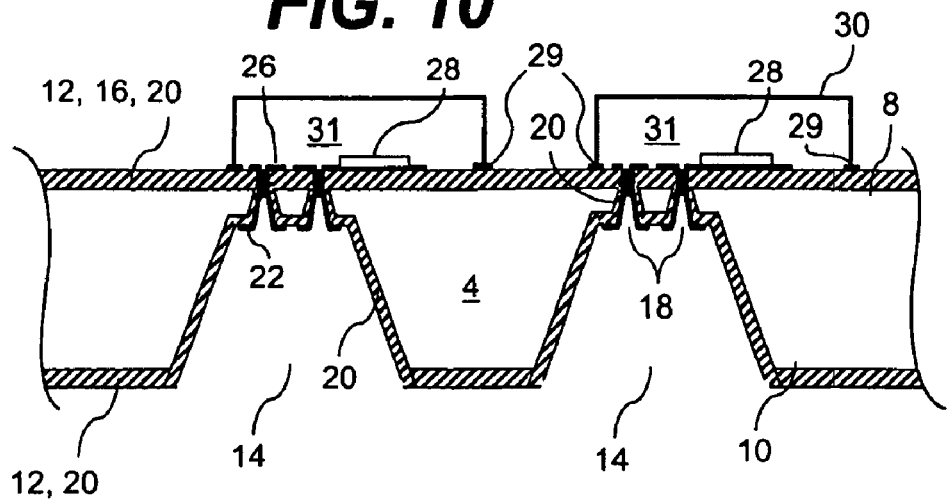

A lid 30 may be attached to the substrate upper surface to form a hermetically enclosed volume 31 in which the electronic device 28 is contained as shown in FIG. 10. The lid 30 is formed of a material which is selected based on desired characteristics of the package, for example, gas permeability, optical properties and coefficient of thermal expansion (CTE). In the case of an optoelectronic or optical MEMS device which sends and/or receives optical signal through the lid, it is generally desired that the material is optically transparent at the desired wavelength(s). Suitable materials for the lid substrate in such as case include, for example, glasses such as Schott BK-7 (Schott North America, Inc., Elmsford, N.Y. USA), Pyrex (Corning Inc., Corning, N.Y. USA) and single crystal silicon. In the exemplary device package, the lid is formed of single-crystalline-silicon.

The lid can be coated on one or more interior and/or exterior surfaces with one or more antireflective or other optical coatings. In addition other materials can be deposited or deposited and patterned on the lid, for example, getters such as non-evaporable getters. Where optical transparency of the lid is not required, a non-transparent lid material may be used and may be the same as that of the substrate. Optionally, etched, stamped or otherwise-formed metals can serve as the lid. An exemplary metal for use in the lid is tantalum, which has a CTE close to that of silicon.

The lid is of a size sufficient to enclose the desired portion of the substrate upper surface. A typical length and width for a rectangular lid ceiling portion is, for example, on the order of from 1 to 50 mm. As with the base substrate, the lid substrate can be in wafer-form, making possible the simultaneous manufacture of multiple lids. The resulting base substrate and lid wafers can be assembled together on the wafer-level, allowing for a completely wafer-level manufacturing process. Suitable lid formation techniques are known in the art and described in the aforementioned U.S. Patent Application Publication No. US20050111797A1.

The lid wafers can be pre-machined to allow electrical contact to the substrate wafer without added machining after dicing. This can allow for wafer-level testing before singulation of the individual packages while minimizing the mechanical stress and cost of post-machining operations to create such openings after the sealing operation. Such pre-machined lid wafers may be formed by known methods such as hot-molding, etching, and/or abrasive blasting. This may be useful where both front and back side electrical contact are desired. In addition the lids may be made from an SOI wafer to better allow the lid top surface to have a controlled thickness. This is useful to allow the lid to serve as a leak sensor by choosing a thickness that will cause a known, measurable bulge when a pressure of helium or other gas is sealed inside the enclosed volume, or when the sealed device is bombed in helium or other gas. In such a case, the lid effectively becomes a pressure gauge that can aid in determining the exact leak rate against the gases sealed inside or the ability of the package to resist a pressure of gas such as helium applied outside the package for a period of time. Bow, or deflection, in the lid can be measured on an interferometer such as those made by Wyko and Zygo Corporation. Optionally, a specific region of the lid may be thinned to serve as a deflection membrane or etched to another membrane material.

For wafer-level processing, the lids may be attached individually to the device substrate or in wafer form. For lid attachment, the lid bonding material may include a solder glass or metal as explained above. The process of sealing the lid may involve baking the lid and substrate with the bonded electronic component in a controlled environment, for example, with an inert gas such as helium, argon or nitrogen or under vacuum, to remove any water vapor present. Pressure may then be applied between the lid and substrate and the part is heated to the reflow temperature of the metal solder. Optionally, the pressure may be applied after the reflow temperature is reached. It may be beneficial to seal the package under a pressure of helium such that when cooled, the sealed area has a pressure significantly higher than atmospheric pressure. This technique will allow for monitoring the level of hermeticity or leak rate in the package at any time subsequent to making the hermetic seal.

Figure 11:
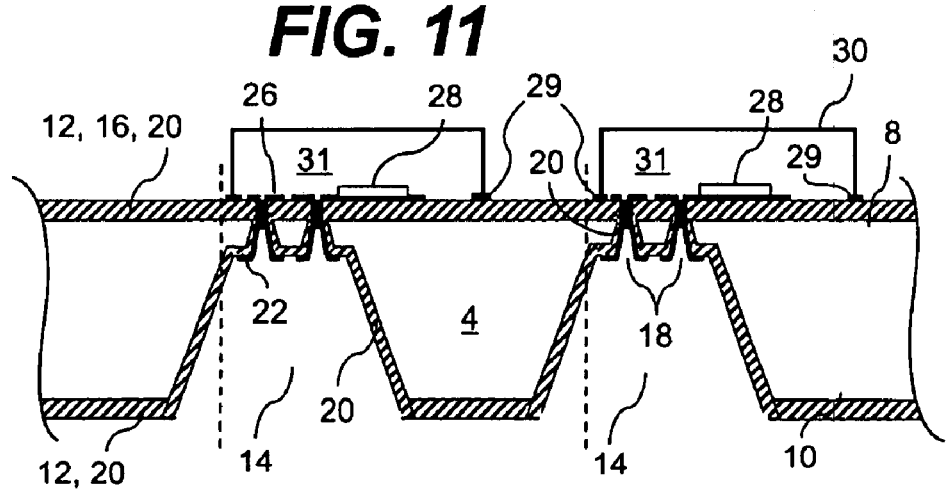
Figure 12:
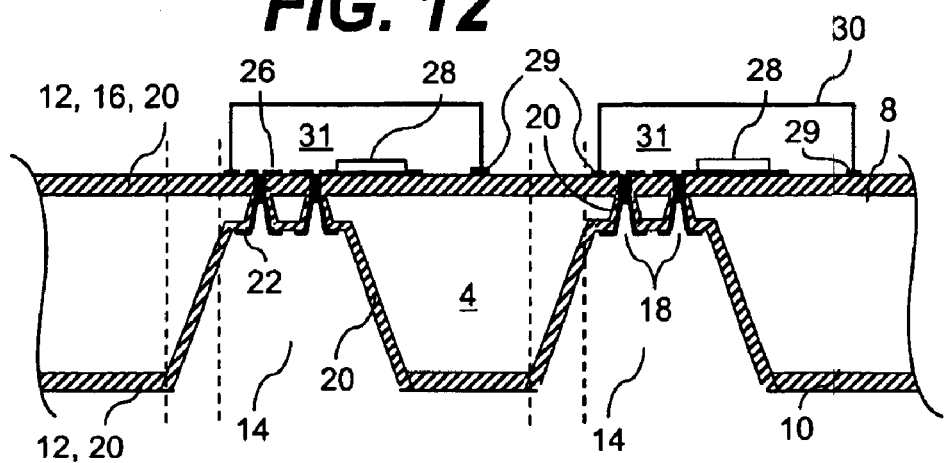
Figure 13:
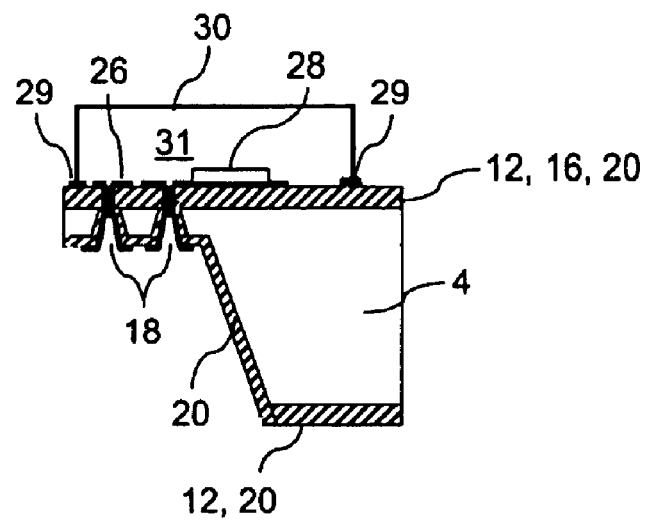
Figure 14:
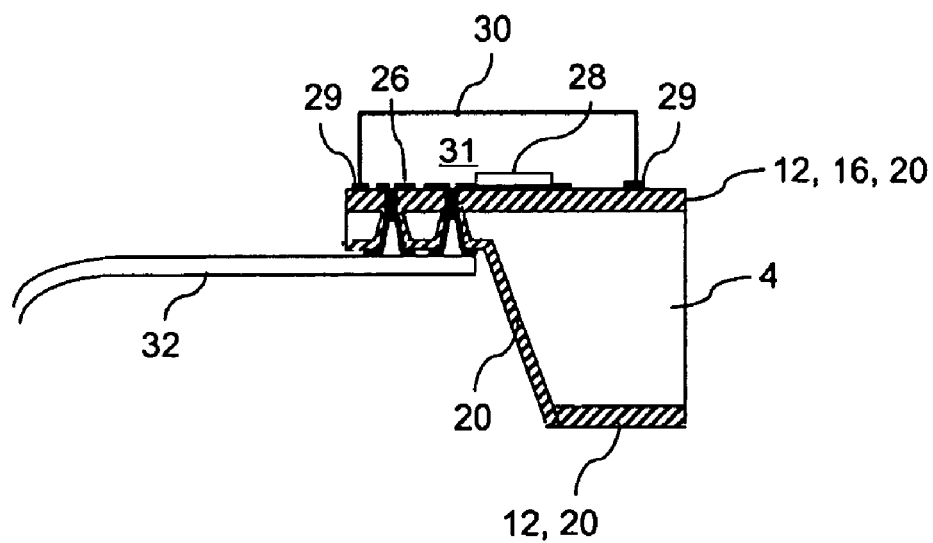

In the case of a wafer-level manufacturing process, the device packages formed as multiple die are singulated, for example, by dicing through the substrate between adjacent packages. FIG. 11 illustrates suitable lines along which the substrate may be diced to allow singulation of the packages, as indicated by the dashed lines. As illustrated, dicing may advantageously be conducted along the locally thinned region for purposes of facilitating electrical connectivity with external circuitry, for example, with a flex circuit 32 such as illustrated in FIG. 14. If vertical surfaces are desired at the package edges, additional dicing may be conducted, for example, as illustrated by the dashed lines in FIG. 12. The result of such singulation is shown in FIG. 13, which illustrates a package resulting from singulation.

After singulation of the device package, an electrical connection may be provided for electrical connectivity with external devices. FIG. 14 illustrates connection of a flex circuit 32 to the conductive microvia for this purpose. Flex circuits are typically made of polyimides, LCP, or other suitable substrates. The flexible circuit contains one or more metal traces (not shown) on or in the substrate material. Typically, flexible circuits are made from more than one layer. The flex circuit may easily be attached to the conductive via from the substrate back surface, as the locally thinned region provides convenient access thereto. The flex circuit may be attached to the conductive via by known techniques such as soldering, for example, with tin-based solder balls or with patterned solders on the flex or substrate. FIG. 15 illustrates an elevated view of an exemplary electronic device package base substrate in accordance with the invention, and a bottom-up view of the micro-vias in the locally thinned region. The dashed arrow represents the cross-sectional view for FIG. 13. The features on the substrate upper surface such as the device lid are not shown. Five micro-vias and metal traces for the vias can be seen in the locally thinned region for providing electrical connectivity with electronic devices of the package.

Figure 16:
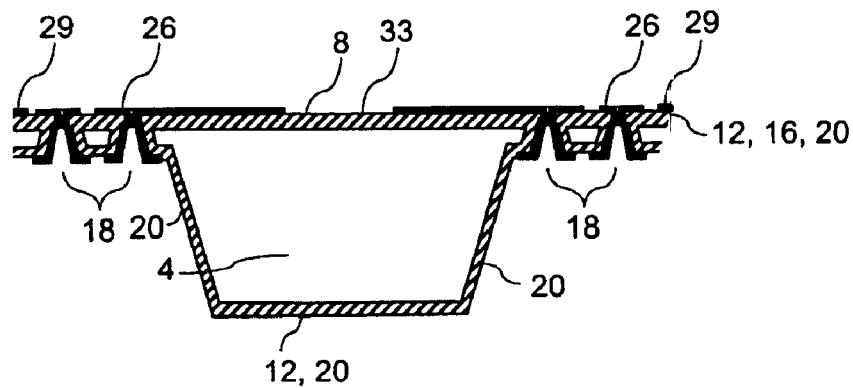
FIGS. 16-19 illustrate cross-sectional views of an exemplary electronic device package at various stages of formation thereof in accordance with a further aspect of the invention.

In addition to the above-described methods for forming electronic packages, variations thereof are envisioned. For example, FIGS. 16-19 illustrate cross-sectional views of an exemplary electronic device package at various stages of formation in which micro-vias are provided on two or more sides of the electronic device. In FIG. 16, two micro-vias 18 are shown on opposite sides of an electronic device mounting region 33. It should be clear that any number of peripheral micro-vias can be made to connect to metallizations and/or microelectronics on the upper surface of the substrate, and to allow electrical connection to one or more devices mounted or formed on the substrate surface or on a lid surface.

Figure 17:
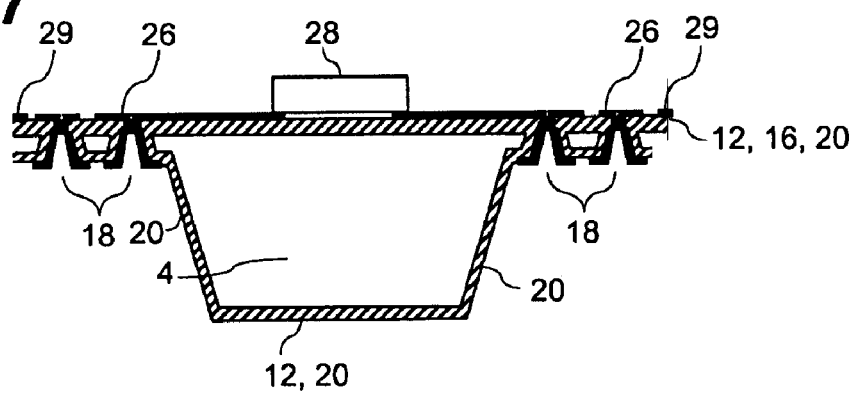

FIG. 17 illustrates an electronic device 28 mounted to the substrate upper surface 8. The electronic device may be attached, for example, by solders deposited on the device or on the wafer surface or other attach methods known in the art. The electronic devices may be flip-chip attached to make electrical connection to the metal traces on the top surface of the substrate wafer. Alternatively, they may be ball or wedge wire bonded, or a combination thereof. Although a single electronic device is shown, it should be clear that multiple electronic devices may be attached. In addition, such devices may be formed on or in the substrate surface instead of being attached thereto, as described above.

Figure 18:
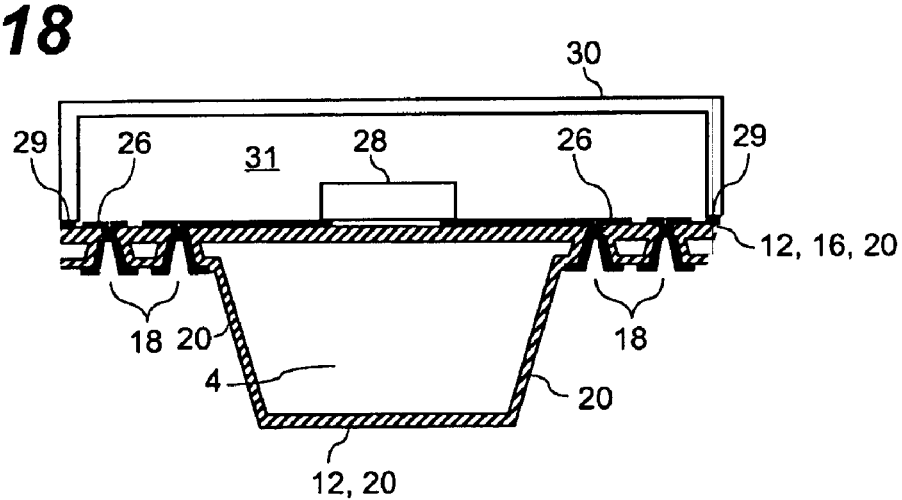

As shown in FIG. 18, a lid 30 such as described above is attached to metal sealing ring 29 on the substrate upper surface, or is otherwise bonded to the substrate upper surface as described above. Typically, all steps up to and including the lid bonding would be done on a wafer or grid level, as described above.

Figure 19:
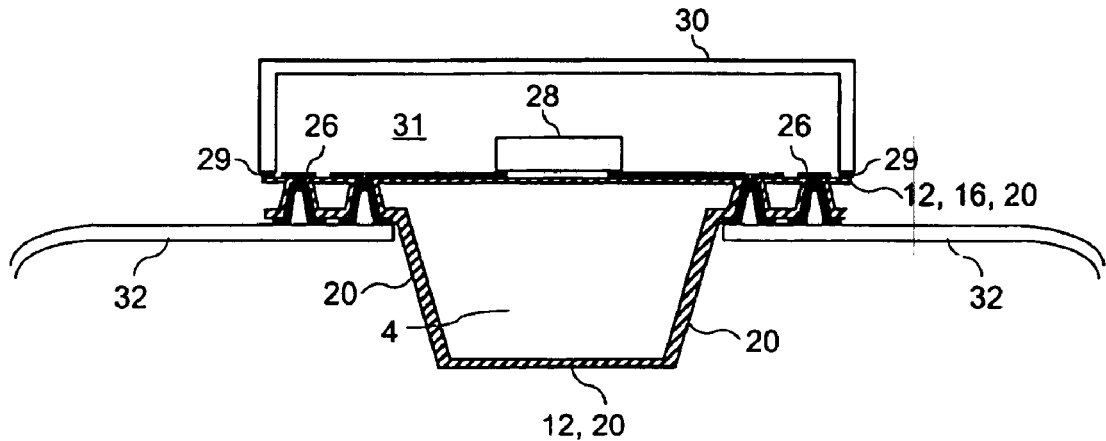

FIG. 19 shows the package of FIG. 18 after singulation of the die, in the case of a wafer-level process. A flexible circuit 32 is attached to the substrate 4 at the locally thinned regions for electrical connection to the micro-vias 18 by metal traces patterned on the back surface of the substrate, in the manner described above with reference to FIG. 14. The flex circuit may contain a region that is cut out to attach to the package as shown, or a plurality of flex circuits may be attached to one package.

Optionally, the packaged device of FIG. 18 may be mounted to a circuit board. In this case the flex circuits 32 shown in FIG. 19 would represent a circuit board material. The circuit board may contain a region that is cut out to contain the thicker region of the package or solderballs may bridge the recessed region to the circuit board. Still further options for connection of the package include, for example, lead frames, gull wings, and the like.

Figure 20:
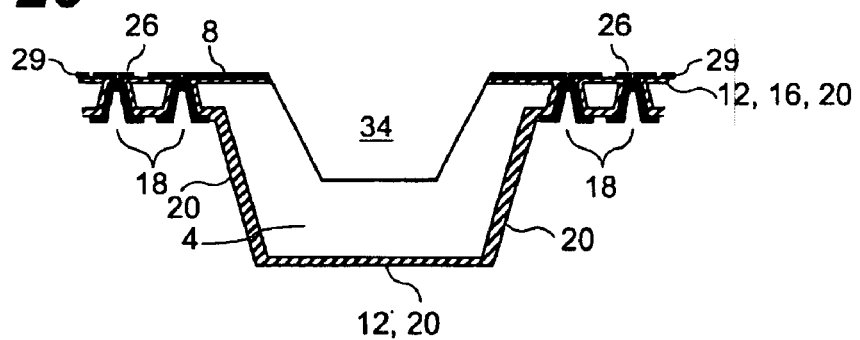
Figure 21:
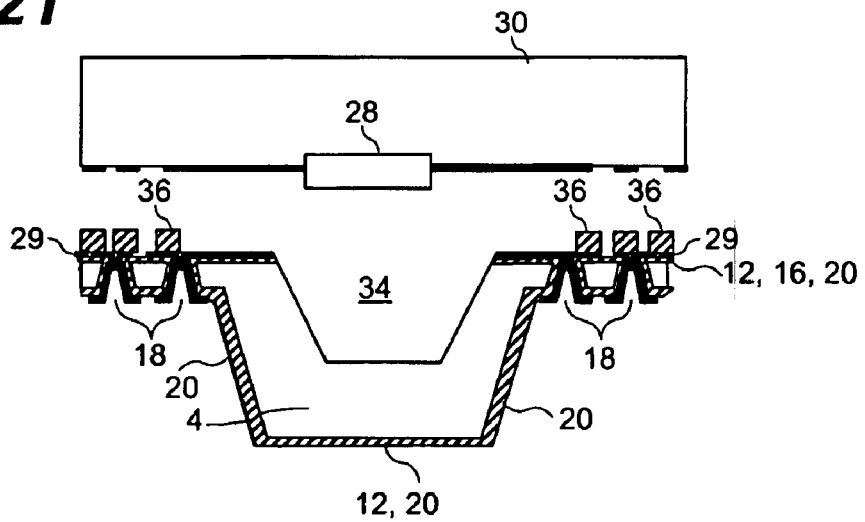

FIGS. 20-23 illustrate an exemplary electronic device package at various stages of formation in accordance with a further aspect of the invention. This structure is similar to those described with reference to FIGS. 13 and 19, with the substrate containing a recessed region 34 to allow clearance for an electronic device 28 attached or formed in or on a lid 30, which may be part of a lid wafer. FIG. 20 illustrates the substrate 4 with electrical traces 26 and an optional outer seal ring 29. The substrate in this case has a patterned attach material such as solder 36 as shown in FIG. 21. The solder 36 provides an electrical connection between the micro-vias 18 and traces 26 on the substrate and the electronic device 28 on the lid 30. The outermost solder 36. would typically be a ring of sealing material that circumscribes the chip and serves to hermetically seal the base and lid together, typically while both are at a wafer level. In this case the substrate 4 containing the micro-vias may have a thinned region with a membrane to ensure the seal is hermetic. Such a structure is similar to the bow/deflection-measurable structure described above. As illustrated in FIG. 22, the base substrate 4 and lid 30 are bonded together with the outer seal region creating a hermetic seal, while the inner bonded regions are electrical connection points to electrically connect the metal traces and micro-vias on the substrate 4 with the relevant electrical traces and I/O of the electronic device 28 mounted to or formed in or on the lid 30. FIG. 23, similar to FIG. 19, shows the packaged device after singulation from the wafer-level, and electrically attached to a flex circuit 32 or circuit board.

FIG. 24 illustrates an elevated view of an exemplary electronic device package base substrate in accordance with a further aspect of the invention. In forming the locally thinned region 15 of the substrate 4, substrate material is not removed on three sides of the region. In this way additional structural rigidity can be provided to the substrate. The features on the substrate upper surface such as the device lid, electronic device and metal traces are not shown. In this exemplary substrate, four micro-vias 18 and metal traces 22 for the vias can be seen in the locally thinned region.

While the invention has been described in detail with reference to specific embodiments thereof, it will be apparent to one skilled in the art that various changes and modifications can be made, and equivalents employed, without departing from the scope of the claims.

What is claimed is:

1. An electronic device package, comprising:
   a substrate having a first surface and a second surface opposite the first surface, wherein the second surface has a locally thinned region therein;
   a conductive via in the locally thinned region extending through the substrate to the first surface, wherein the conductive via and the locally thinned region each comprise a tapered sidewall, wherein the taper of the conductive via sidewall and of the locally thinned region sidewall are in the same direction; and
   an electronic device connected to the conductive via;
   wherein the substrate comprises a diced portion wherein the substrate is diced through the locally thinned region adjacent to the conductive via.

2. The electronic device package of claim 1, wherein the substrate comprises single-crystal-silicon.

3. The electronic device package of claim 1, further comprising a lid on the first surface to form a sealed volume which encloses the electronic device.

4. The electronic device package of claim 3, wherein the electronic device is mounted to the lid.

5. The electronic device package of any of claim 1, wherein the electronic device is hermetically sealed in the electronic device package.

6. The electronic device package of any of claim 1, wherein the locally thinned region extends to a first edge of the substrate.

7. The electronic device package of any of claim 1, wherein the electronic device is an optoelectronic device.

8. A wafer-level electronic device package, comprising a substrate having a plurality of die, wherein each said die contains an electronic device package of claim 1.

9. A method of forming an electronic device package, comprising:
- (a) providing a substrate having a first surface and a second surface opposite the first surface;
- (b) thinning a portion of the substrate from the second surface to form a locally thinned region in the second surface;
- (c) etching a via in the locally thinned region extending through the substrate, wherein the etching is conducted in a direction from the locally thinned surface to the first surface;
- (d) metallizing the via, wherein the conductive via and the locally thinned region each comprise a tapered sidewall, wherein the sidewall tapers of the conductive via and of the locally thinned region are in the same direction;
- (e) providing an electronic device which is electrically connected to the conductive via; and
- (f) dicing a portion of the substrate through the locally thinned region adjacent to the conductive via.

10. The electronic device package of claim 1, wherein the diced portion includes a portion of the locally thinned region.

11. The method of forming an electronic device package of claim 9, wherein the diced portion includes a portion of the locally thinned region.

* * * * *